United States Patent [19]

Dickmann

[11] Patent Number: 5,464,995
[45] Date of Patent: Nov. 7, 1995

[54] HETEROSTRUCTURE FIELD EFFECT TRANSISTOR INCLUDING A PULSE DOPED CHANNEL

[75] Inventor: Jürgen Dickmann, Ulm-Einsingen, Germany

[73] Assignee: Daimler-Benz Aktiengesellschaft, Stuttgart, Germany

[21] Appl. No.: 257,448

[22] Filed: Jun. 8, 1994

Related U.S. Application Data

[63] Continuation of Ser. No. 915,580, Jul. 20, 1992, abandoned.

[30] Foreign Application Priority Data

Jul. 19, 1991 [DE] Germany .................. 41 23 939.3

[51] Int. Cl.$^6$ ................ H01L 29/784; H01L 29/812; H01L 29/80
[52] U.S. Cl. ............................. 257/192; 257/194
[58] Field of Search .................... 257/192, 194, 257/19, 29, 15, 20, 24, 627

[56] References Cited

U.S. PATENT DOCUMENTS

| | | | |
|---|---|---|---|
| 4,593,301 | 6/1986 | Inata et al. | 257/194 |
| 5,032,893 | 7/1991 | Fitzgerald, Jr. et al. | 257/627 |
| 5,155,571 | 10/1992 | Wang et al. | 257/19 |
| 5,262,660 | 11/1993 | Streit et al. | 257/194 |
| 5,266,506 | 11/1993 | Green, Jr. | 257/192 |

FOREIGN PATENT DOCUMENTS 0214047  3/1987  European Pat. Off. .

OTHER PUBLICATIONS

Smith et al; "A 0.25 μm gate–length Pseudomorphic HFET with 32–mW output power at 94 GHz"; IEEE Electron device Letters; vol. 10; No. 10; Oct. 1989.

S. M. Sze; "Semiconductor devices physics and Technology"; 1985 pp. 267–268.

Liu et al; "Analysis of Several . . . ", 1991 pp. 253–258.
Saunier et al; "AlGaAs/InGaAs Heterostructures . . . ", Oct. 1989.
Patent Abstracts of Japan, vol. 010, No. 367 (E–462) Dec. 9, 1986, JP–A–61 161 773 (Matsushita Electric Ind. Co. Ltd), Jul. 22, 1986.
Patent Abstracts of Japan, vol. 13, No. 348 (E–799) (3696) Aug. 4, 1989, JP–A–10 108 779 (Fujitsu), Apr. 26, 1989.
Papaioannou et al., "Psuedomorphic InGaAs HEMTs . . . " Superlattices and Microstructures, vol. 8, No. 3, 1990, pp. 341–344.
IEEE Electron Device Letters, vol. 9, No. 8, Aug. 1988 Paul Saunier et al.: "A Double–Heterojunction . . . ".
IEEE Transactions On Electron Devices, vol. 36, No. 10 Oct. 1989; Paul Saunier et al.: "AlGaAs/InGaAs Heterostructures . . . ".
IEEE Journal of Quantum Electronics, vo. QE–22, No. 9, Sep. 1986; Hiroyuki Sakaki: "Physical Limits of . . . ".
IEEE Journal Of Applied Physics, vol. 30, No. 2A, Feb. 1991, pp. L 166–L 169; Kohji Matsumura et al.: "A New Hight Electron . . . ".
IEEE Transactions On Electron Devices, vol. 37, No. 10 Oct. 1990; P. Paul Ruden et al.: "AlGaAs/InGaAs/GaAs Quantum Well . . . ".

Primary Examiner—Robert P. Limanek
Assistant Examiner—Wael M. Fahmy
Attorney, Agent, or Firm—Spencer, Frank & Schneider; Christopher H. Lynt

[57] ABSTRACT

The present invention relates to a heterostructure yield effect transistor with high charge carrier mobility and velocity wherein the current carrying channel has only a narrow pulse doped region that is disposed on the side of the channel layer opposite the heterojunction. At positive gate voltages the remainders of the doping substance are spatially separated from the free charge carriers so that the free charge carriers exhibit transporting characteristics as they are encountered in the undoped channel but with a substantially higher saturation current.

20 Claims, 1 Drawing Sheet

HETEROSTRUCTURE FIELD EFFECT TRANSISTOR INCLUDING A PULSE DOPED CHANNEL

CROSS REFERENCE TO RELATED APPLICATION

This application is a continuation of application Ser. No. 07/915,580, filed Jul. 20, 1992, now abandoned.

BACKGROUND OF THE INVENTION

The present invention relates to a heterostructure field effect transistor for controlling the heterostructure field effect transistor having a current carrying channel layer composed of a semiconductor material having a high charge carrier mobility.

Such heterostructure field effect transistors are employed in analog high frequency circuits, for example, in monolithically integrated transmitter and receiver modules or in power amplifiers.

Publications by Saunier et al in IEEE Electron Device Letters, Vol. 9, No. 8, 1988, pages 397–398, and in IEEE Transactions on Electron Devices, Vol 36, No. 10, 1989, pages 2231–2234, disclose the incorporation of doping substances in the conductive channel of heterostructure field effect transistors (HFET) as homogeneous doping or in the form of a broad doping pulse. However, such doping worsens the transporting characteristics of the electrons in the HFET channel, that is, the mobility and drift velocity of the charge carriers becomes lower than in an undoped HFET.

SUMMARY OF THE INVENTION

It is therefore an object of the present invention to increase the saturation current of an HFET without adversely influencing its high frequency characteristics.

This is accomplished by a current carrying channel layer of a heterostructure field effect transistor composed of a semiconductor material having a high charge carrier mobility, wherein a side of the channel layer opposite the heterojunction is doped only in a narrow region. It is also accomplished by a method of controlling a heterostructure field effect transistor comprising the steps of incorporating the doping substance as a narrow pulse over the entire area of the channel layer on the side opposite the heterojunction and applying a positive gate voltage to spatially separate a remainder of the doping substance from the free charge carriers in the channel layer resulting in a high saturation current. Other advantageous features and/or modifications are described below.

By the incorporation of the doping as a very narrow pulse on the side of the channel layer opposite the heterojunction of the HFET, the center of gravity of the dwell probability $|\phi_0|^2$ of the electrons ($\phi_0$=electron wave function) is spatially separated from the locus of the incorporated doping at positive gate voltages (FIG. 1). This causes the Coulomb scattering to be reduced. The reduction of the Coulomb scattering leads to greater mobilities and velocities of the charge carriers in the channel.

The HFET according to the invention therefore has the advantage that additional charge carriers are available in the channel and the transporting characteristics of the transistor are modulated by way of the gate voltage in such a way that the charge carriers exhibit transporting characteristics in the doped channel as they are encountered in the case of the undoped channel, only with a substantially higher saturation current.

BRIEF DESCRIPTION OF THE DRAWINGS

The invention will now be described in greater detail with reference to an embodiment thereof which is illustrated in schematic drawing figures in which.

DETAILED DESCRIPTION OF THE PREFERRED EMBODIMENT

Figure 1:
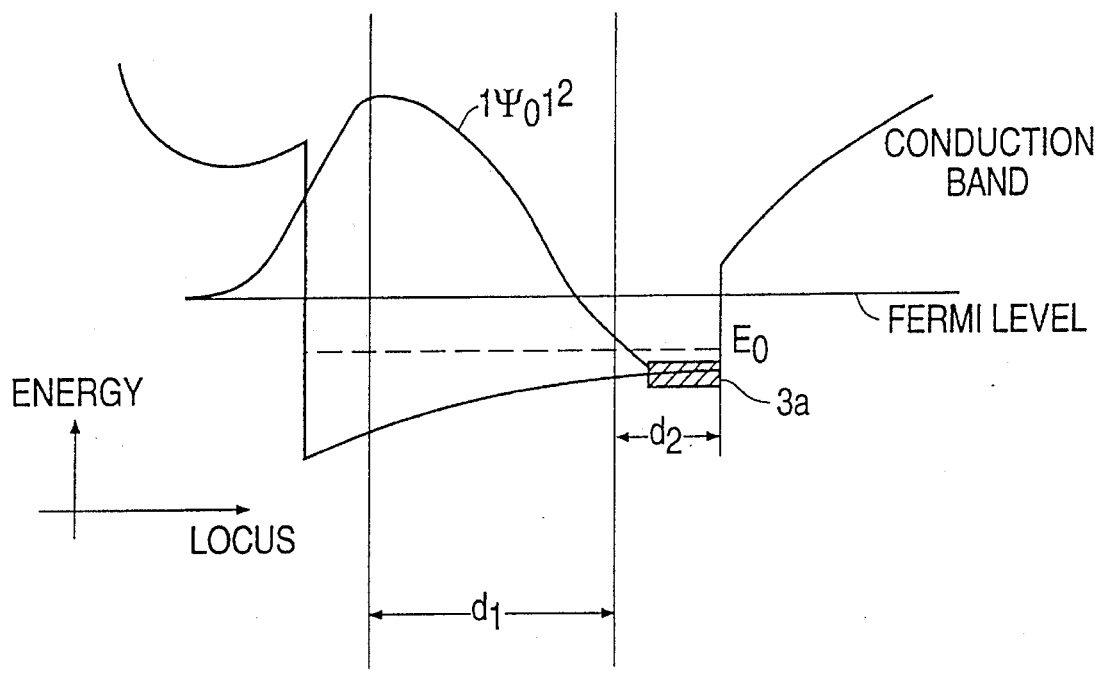
FIG. 1 is a plot of energy versus locus.
Figure 2:
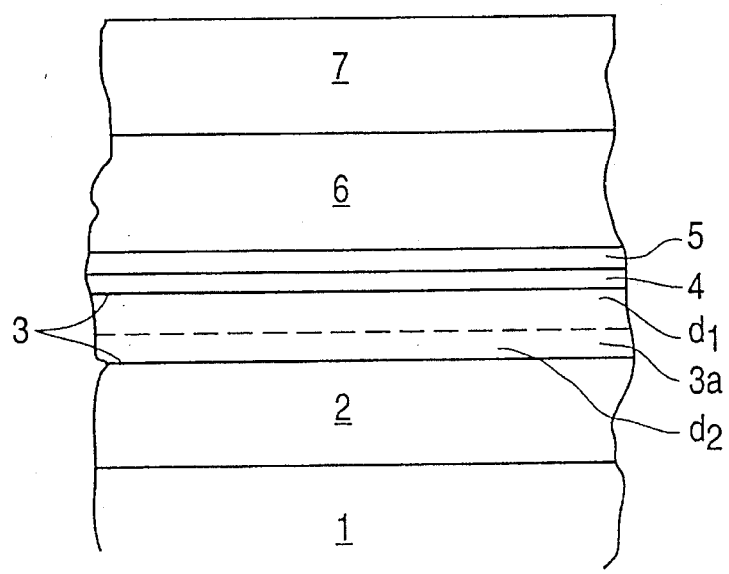
FIG. 2 shows an HEFT according to the present invention.

In order to produce the HFET according to the invention, for example as shown in FIG. 2, a semi-insulating substrate 1, for example of GaAs, is covered with a GaAs buffer layer and an AlGaAs/GaAs covering lattice (superlattice) 2. On this structure, an $In_{0.2}Ga_{0.8}As$ (or more generally $In_yGa_{1-y}As$) layer 3 is grown to a thickness of, for example, 12 nm. A narrow pulse introduces a thin doping of, for example, Si to a thickness of $d_2=2$ nm into this layer 3 along the entire side of the layer 3 opposite the heterojunction. The space between channel doping 3a and the heterojunction formed of InGaAs layer 3 and the GaAs layer 4 grown thereon is $d_1=10$ nm. GaAs layer 4 is undoped and has a thickness of 2 nm. On it is grown an undoped $Al_{0.25}Ga_{0.75}As$ layer 5 that is 3 nm thin, a $Al_{0.25}Ga_{0.75}As$ layer 6 that is 40 nm thick and has a negative charge carrier concentration of $3 \cdot 10^{18}$ cm$^{-3}$ as well as a GaAs layer 7 that is 30 nm thick and has a negative charge carrier concentration of up to $10^{19}$ cm$^{-3}$. Instead of the highly doped AlGaAs layer 6, an AlGaAs layer including a pulse doped region covering 10 nm and incorporating $5 \cdot 10^{-12}$ charge carriers per cm$^2$ can also be grown to a total layer thickness of 35 nm.

With the HFET according to FIG. 2, it is possible to realize, with a positive gate voltage of 0.5V, saturation currents of about 720 mA/mm which have a slope of 625 mS/mm. This permits the realization of frequencies up to $f_{max}=195$ GHz.

With a negative gate voltage, the transistor according to the present invention attains very good blocking characteristics in spite of the additional channel doping.

However, the present invention is not limited to the materials mentioned in the embodiment but is suitable for all semiconductor materials which permit the manufacture of an HEMT (high electron mobility transistor). The layer thickness dopings and the indium/aluminum concentrations must here be adjusted to one another. For example, $Al_{0.3}Ga_{0.7}As/In_{0.25}Ga_{0.75}As$ heterostructures can also be employed. Generally, heterostructures of III/V semiconductor compounds such as, for example, AlGaAs/GaAs/AlGaAs or AlGaAs/InGaAs, or InAlAs/InGaAs, or InAlAs/InGaAs/InP, or InP/InGaAs, or InSb/AlSb, or Si/SiGe heterostructures as disclosed in German Unexamined Published Patent Application DE-OS 3,731,000 can be employed. The significant factor for the heterostructures employed is that the layer thickness of the channel layer is selected based on whether the lattice structure is strained or unstrained. For strained lattice heterostructures, in which no lattice relaxation occurs, the channel layer thickness is selected as sub-critical. In other words, the sub-critical thickness is a layer thickness which is less than the critical thickness at which relaxation occurs. For unstrained lattice structures, in which lattice relaxation occurs, the channel layer thickness is selected as large as possible. Pulse doping must be limited to the side of the channel opposite the heterojunction.

It will be understood that the above description of the present invention is susceptible to various modifications, changes and adaptations, and the same are intended to be comprehended within the meaning and range of equivalents of the appended claims.

What is claimed is:

1. A heterostructure field effect transistor having active transistor layers comprising: a heterojunction and a current carrying channel layer composed of a semiconductor material having a high charge carrier mobility, the improvement wherein:

a side of the channel layer opposite the heterojunction is doped only in a narrow region within the channel so that the doped narrow region is asymmetrically disposed in the channel layer; and the doped narrow region extends along and in direct contact with the entire layer edge of the channel layer opposite the heterojunction.

2. A heterostructure field effect transistor according to claim 1, wherein the active transistor layers are III/V semiconductor compounds.

3. A heterostructure field effect transistor according to claim 1, wherein the active transistor layers include an unstrained semiconductor lattice structure and a thick channel layer.

4. A heterostructure field effect transistor according to claim 1, wherein the active transistor layers are lattice-mismatched semiconductor layers and the channel layer has a sub-critical thickness.

5. A heterostructure field effect transistor according to claim 2, wherein the channel layer is composed of $In_yGa_{1-y}As$; the channel layer has a thickness of 12 nm;

the channel layer includes a pulse doped region of $d_2=2$ nm spaced at a distance $d_1=10$ nm from the heterojunction; and the channel layer is doped with Si at $1\times10^{12} cm^{-2}$.

6. A heterostructure field effect transistor according to claim 1, wherein the transistor layers are constructed of an Si/SiGe layer sequence including said channel layer of pulse doped SiGe of sub-critical thickness.

7. A method of controlling a heterostructure field effect transistor according to claim 1, comprising the steps of:

incorporating the doping substance as a narrow pulse over the entire area of the channel layer on the side opposite the heterojunction; and applying a positive gate voltage to spatially separate a remainder of the doping substance from the free charge carriers in the channel layer resulting in a high saturation current.

8. A method according to claim 7, further comprising the step of applying a negative gate voltage to provide good blocking characteristics.

9. A heterostructure field effect transistor according to claim 5, wherein y=0.2 so that the channel layer is composed of $In_{0.2}Ga_{0.8}As$.

10. A heterostructure field effect transistor according to claim 5, wherein y=0.25 so that the channel layer is composed of $In_{0.25}Ga_{0.75}As$.

11. A heterostructure field effect transistor according to claim 1, wherein the narrow region extends along the entire side of the channel layer opposite the heterojunction.

12. In a heterostructure field effect transistor having:

a substrate layer;

a channel layer disposed above said substrate layer and including a semiconductor material having a high charge carrier mobility;

an undoped layer disposed above said substrate layer and said channel layer, and forming a heterojunction with said channel layer; and a doped layer disposed above said substrate layer, said channel layer and said undoped layer;

the improvement wherein:

a side of said channel layer opposite the heterojunction is doped only in a narrow region within the channel layer so that the doped narrow region is asymmetrically disposed in the channel layer; and the doped narrow region extends along and in direct contact with the entire layer edge of the channel layer opposite the heterojunction.

13. A heterostructure field effect transistor according to claim 12, wherein said doped layer, said undoped layer and said channel layer are III/V semiconductor compounds.

14. A heterostructure field effect transistor according to claim 12, further comprising a buffer layer located below said doped layer, said undoped layer and said channel layer and located above said substrate.

15. A heterostructure field effect transistor according to claim 14, wherein said buffer layer comprises a GaAs layer and a AlGaAs/GaAs superlattice.

16. A heterostructure field effect transistor according to claim 14, wherein said buffer layer and said channel layer are adjacent, and said channel layer has an unstrained semiconductor lattice structure and a thickness value which is greater than a critical thickness.

17. A heterostructure field effect transistor according to claim 14, wherein said buffer layer and said channel layer are adjacent, and said channel layer has a strained semiconductor lattice structure and a thickness value which is less than a critical thickness.

18. A heterostructure field effect transistor according to claim 12, wherein: said channel layer is composed of $In_yGa_{1-y}As$; said channel layer has a thickness of 12 nm including said narrow region of a thickness $d_2=2$ nm spaced at a distance $d_1=10$ nm from the heterojunction; and said narrow region of said channel layer is doped with Si at $1\times10^{12} cm^{-2}$.

19. A heterostructure field effect transistor according to claim 14, wherein: said substrate layer is composed of GaAs; said buffer layer is composed of GaAs and an AlGaAs/GaAs superlattice; said channel layer is composed of $In_yGa_{1-y}As$; said undoped layer has a first sub-layer composed of GaAs beneath a second sub-layer composed of AlGaAs; and said doped layer has a first sub-layer composed of AlGaAs with a negative charge carrier concentration of $3\times10^{18} cm^{-3}$ beneath a second sub-layer composed of GaAs with a negative charge carrier concentration not greater than $1\times10^{19} cm^{-3}$.

20. A heterostructure field effect transistor according to claim 14, wherein: said substrate layer is composed of GaAs; said buffer layer is composed of GaAs and an AlGaAs/GaAs superlattice; said channel layer is composed of $In_yGa_{1-y}As$; said undoped layer has a first sub-layer composed of GaAs beneath a second sub-layer composed of AlGaAs; and said doped layer has a first sub-layer composed of AlGaAs having a pulse doped region of a thickness of 10 nm with a negative charge carrier distribution of $5\times10^{12} cm^2$ beneath a second sub-layer composed of GaAs with a negative charge carrier concentration not greater than $1\times10^{19} cm^{-3}$.

* * * * *